United States Patent
Okada et al.

(10) Patent No.: US 9,453,291 B2
(45) Date of Patent: Sep. 27, 2016

(54) SINGLE CRYSTAL PULLING APPARATUS AND LOW HEAT CONDUCTIVE MEMBER USED FOR SINGLE CRYSTAL PULLING APPARATUS

(75) Inventors: Osamu Okada, Mitoyo (JP); Masaaki Kawakami, Mitoya (JP)

(73) Assignee: TOYO TANSO CO., LTD., Osaka-shi, Osaka (JP)

( * ) Notice: Subject to any disclaimer, the term of this patent is extended or adjusted under 35 U.S.C. 154(b) by 575 days.

(21) Appl. No.: 13/881,074

(22) PCT Filed: Nov. 21, 2011

(86) PCT No.: PCT/JP2011/076798
§ 371 (c)(1),
(2), (4) Date: Apr. 23, 2013

(87) PCT Pub. No.: WO2012/070528
PCT Pub. Date: May 31, 2012

(65) Prior Publication Data
US 2013/0233241 A1    Sep. 12, 2013

(30) Foreign Application Priority Data

Nov. 22, 2010  (JP) ................................. 2010-260242
Jun. 27, 2011  (JP) ................................. 2011-141661

(51) Int. Cl.
*C30B 15/02* (2006.01)
*C30B 15/14* (2006.01)
(Continued)

(52) U.S. Cl.
CPC .............. *C30B 15/14* (2013.01); *C30B 15/10* (2013.01); *C30B 15/30* (2013.01); *C30B 29/06* (2013.01); *Y10T 117/1032* (2015.01); *Y10T 117/1068* (2015.01); *Y10T 117/1072* (2015.01)

(58) Field of Classification Search
CPC ....... C30B 15/02; C30B 15/14; C30B 15/20; C30B 15/10
See application file for complete search history.

(56) References Cited

U.S. PATENT DOCUMENTS 3,291,571 A    12/1966  Dohmen et al
4,888,242 A    12/1989  Matsuo et al.
(Continued)

FOREIGN PATENT DOCUMENTS

FR    2 071 776 A5    9/1971
JP    58-125689 A     7/1983
(Continued)

OTHER PUBLICATIONS

International Search Report PCT/JP2011/076798, Mailing Date of Dec. 20, 2011.
(Continued)

*Primary Examiner* — Robert M Kunemund
(74) *Attorney, Agent, or Firm* — Westerman, Hattori, Daniels & Adrian, LLP

(57) ABSTRACT

A single crystal pulling apparatus (1) has a quartz crucible (2) for accommodating silicon melt (3), a graphite crucible (4) for retaining the quartz crucible (2), a tray (5) for securing and holding the graphite crucible (4) from below, and a crucible rotating shaft (6) for supporting the tray (5) from below and for elevating and lowering the tray (5) and the crucibles (2), (4) while rotating them. A low heat conductive member (10) is interposed on a joint surface between the tray (5) and the crucible rotating shaft (6). The low heat conductive member (10) is formed in a substantially tubular shape, and is interposed in such a manner that a protruding portion of the crucible rotating shaft (6) is inserted through a center hole of the low heat conductive member (10). Thereby, a gap portion (11) is formed below a bottom portion of the tray (5).

14 Claims, 10 Drawing Sheets

(51) Int. Cl.
*C30B 15/10* (2006.01)
*C30B 29/06* (2006.01)
*C30B 15/30* (2006.01)

(56) References Cited

U.S. PATENT DOCUMENTS

| | | | |
|---|---|---|---|
| 5,207,992 A | 5/1993 | Matsuo et al. | |
| 2009/0072202 A1* | 3/2009 | Ren | C30B 15/14 252/501.1 |

FOREIGN PATENT DOCUMENTS

| | | |
|---|---|---|
| JP | 58-121377 U | 8/1983 |
| JP | 64-14189 A | 1/1989 |
| JP | H03-208881 A | 9/1991 |
| JP | H04-198084 A | 7/1992 |
| JP | H08-59387 A | 3/1996 |
| JP | 2528285 B2 | 8/1996 |
| JP | 09-255475 A | 9/1997 |
| JP | 10-081592 A | 3/1998 |
| JP | 2000-72588 A | 3/2000 |
| JP | 2000-143394 | 5/2000 |
| JP | 2000-169294 A | 6/2000 |
| JP | 2000-169295 A | 6/2000 |
| JP | 2002-220296 A | 8/2002 |
| JP | 2005-225718 A | 8/2005 |
| KR | 2003-0050334 A | 6/2003 |
| WO | 02/072926 A1 | 9/2002 |

OTHER PUBLICATIONS

Extended European Search Report dated Apr. 11, 2014, issued in corresponding European Patent Application No. 11843787.0 (10 pages).

Anonymous, "Soft Carbon Felt and Soft Graphite Felt", Chemshine.com, http://www.chemshine.com.cn/carbon/Flexiblecarbon.htm, Cited in Extended European Search Report dated Apr. 11, 2014, issued in corresponding European Patent Application No. 11843787.0.

Written Opinion dated Jul. 16, 2014, issued in corresponding Singaporean Patent Application No. 2013036843 (12 pages).

Japanese Office Action dated Sep. 24, 2014, issued in corresponding Japanese Application No. 2010-260242; w/English Translation. (10 pages).

* cited by examiner

SINGLE CRYSTAL PULLING APPARATUS AND LOW HEAT CONDUCTIVE MEMBER USED FOR SINGLE CRYSTAL PULLING APPARATUS

TECHNICAL FIELD

The present invention relates to a single crystal pulling apparatus for manufacturing a metal single crystal from a metal material that forms a single crystal, such as silicon and germanium, by a Czochralski process, and to a low heat conductive member used for the single crystal pulling apparatus. More particularly, the invention relates to a heat escape prevention structure for preventing heat from escaping out of the furnace from a crucible used for the single crystal pulling apparatus through a crucible rotating shaft.

BACKGROUND ART (First Related Art)

An example of the method for producing a silicon single crystal from polycrystalline silicon is a Czochralski process (hereinafter referred to as a CZ process). Generally, a single crystal pulling apparatus used for the CZ process comprises a quartz crucible for accommodating silicon melt, a graphite crucible for retaining the quartz crucible, a tray for securing and holding the graphite crucible from below, a crucible rotating shaft supporting the tray from below and elevating and lowering the tray and the crucibles while rotating the tray and the crucibles, and a heater disposed around the outer periphery of the graphite crucible, for example. The graphite crucible and the quartz crucible are heated by the heater, whereby silicon is melted.

Since the crucible, the tray and the crucible rotating shaft are all commonly made of graphite in such a single crystal pulling apparatus, the following problems arise. The graphite material has high thermal conductivity. For this reason, the heat inside the crucible is conducted from the tray to the crucible rotating shaft. Consequently, the heat escapes out of the furnace. In other words, the heat quantity provided for melting a metal is conducted through the graphite material and escapes, and therefore, heat loss occurs. This results in a decrease in the temperature inside the crucible, and in order to compensate the heat loss, additional heating corresponding to the loss is necessary. Consequently, the problem of additional electric power consumption arises. Another problem is as follows. When the quantity of heat escape from the crucible bottom portion is great, the temperature of the melted material (such as silicon and germanium) in the quartz crucible bottom portion drops, so convection of the melted material occurs because of the temperature difference between the melted material in the quartz crucible bottom portion and that in the crucible upper portion. Such convection is extremely detrimental to the single crystal pulling apparatus, which prevents a stable pulling process.

In order to solve such problems, it has been proposed to interpose and arrange a low heat conductive member for suppressing heat conduction in a shaft direction in the crucible rotating shaft (see the following Patent Document 1). Patent Document 1 also proposes, for example, that the low heat conductive member is formed of a carbon fiber-reinforced carbon composite material and that the entire crucible rotating shaft is formed of a carbon fiber-reinforced carbon composite material.

(Second Related Art)

An example of the method for producing a silicon single crystal from polycrystalline silicon is a Czochralski process (hereinafter referred to as a CZ process). Generally, a single crystal pulling apparatus used for the CZ process comprises, as shown in FIG. 10, a quartz crucible 50 for accommodating silicon melt, a graphite crucible 51 for retaining the quartz crucible 50, a crucible rotating shaft 52 for elevating and lowering the graphite crucible 51 and the quartz crucible 50, and a heater 53 disposed around the outer periphery of the graphite crucible 51, for example. Note that reference numeral 54 indicates a heat shielding member, reference numerals 55 and 56 indicate gas exhaust passages for, for example, SiO gas, and reference numeral 57 indicates a gas exhaust port.

CITATION LIST

Patent Literature

[Patent Document 1] Japanese Published Unexamined Patent Application No. 10-081592

[Patent Document 2] Japanese Patent No. 2528285

SUMMARY OF INVENTION

Technical Problem

Technical Problem Related to the First Related Art

The conventional example according to Patent Document 1 can suppress the transfer of the heat downward from the crucible via the crucible rotating shaft. However, the low heat conductive member is costly, and suppression of the heat conduction is insufficient. Accordingly, there is a need for a structure that is low in cost and has a greater heat conduction suppression effect.

Another problem of the foregoing conventional example described in Patent Document 1 is as follows. A conventional crucible rotating shaft cannot be used as it is, and the crucible rotating shaft needs to be processed to form grooves, holes, and the like for interposing the low heat conductive member. As a consequence, the manufacturing cost is increased. Moreover, when the entire crucible rotating shaft is formed of a carbon fiber-reinforced carbon composite material, the manufacturing cost becomes considerably higher than conventional crucible rotating shafts, which is impractical.

Accordingly, there has been a need for a single crystal pulling apparatus that can suppress the heat escape out of the furnace from the crucible rotating shaft more effectively and also has a low-cost heat escape prevention structure.

(Technical Problem Related to the Second Related Art)

In the single crystal pulling apparatus as described above, heat is applied from the surrounding area by the heater 53 in order to melt the polycrystalline silicon ingot placed in the quartz crucible 50. If the quartz crucible 50 is directly heated, it is softened and deformed because of high temperature and consequently is broken. For the purpose of preventing this breakage, the graphite crucible 51 is placed outside to retain the quartz crucible. In order to break the graphite crucible 51 because of the difference in shrinkage at the time of cooling from that of the quartz crucible 50, the graphite crucible 51 is generally divided vertically into two or three parts. However, since the quartz crucible 50 and the graphite crucible 51 are brought into high temperature while being in contact with each other at all times at the same position, the following reactions (1) and (2) occur in the graphite crucible 51.

$$C + SiO_2 \rightarrow SiO + CO \qquad (1)$$

$$2C + SiO \rightarrow SiC + CO \qquad (2)$$

Due to these oxidation reactions, the curved surface portion (i.e., curved portion) from the side face of the divided surface toward the bottom face is gradually abraded so that the wall thickness is reduced. At the same time, on the inner surface side, SiC is produced from the inner surface toward the inside because of silicification (SiC) reaction. This SiC is produced in such a way that its thickness is greatest in the vicinity of the curved portion that is kept at a high temperature for the longest time during the single crystal pulling. Because the SiC is produced because silicon (Si) enters the hexagonal crystal of graphite, the inner surface side of the graphite crucible expands in volume three-dimensionally. Vertically the inner surface side expands and consequently the upper portion warps outwardly. Moreover, circumferentially, the graphite crucible tends to deform from the original circular shape into an elliptic shape at the divided surface, because of the volumetric expansion. In other words, the internal stress such as to cause deformation occurs inside the graphite crucible. Such stress increases as the thickness of the SiC increases, and when the crucible is continued to be used as it is, the tensile stress of the graphite will be exceeded at last and the crucible will be broken. Of course, the abrasion in the curved portion of the divided portion also increases as the time of use becomes longer, and consequently, the wall thickness becomes small locally, degrading the safety factor in terms of strength.

In order to avoid such problems arising from the silicification (SiC formation) and the wall thickness decrease resulting from the oxidizing abrasion, the graphite crucible is replaced as a consumable item.

Accordingly, there has been a need for a single crystal pulling apparatus provided with a crucible unit that makes it possible to avoid the problems relating to the graphite crucible that arise from the silicification (SiC formation) and the wall thickness decrease resulting from the oxidizing abrasion.

In view of the foregoing circumstances, it is an object of the present invention to provide a single crystal pulling apparatus that can suppress the heat escape from the crucible rotating shaft to outside the furnace more effectively, that can moreover use the component parts of the single crystal pulling apparatus such as the crucibles, the tray, and the crucible rotating shaft, as they are, and that can keep the manufacturing cost low, and to provide a low heat conductive member used for the single crystal pulling apparatus.

In view of the foregoing circumstances, it is another object of the present invention to provide a single crystal pulling apparatus that makes it possible to avoid the problems relating to the graphite crucible that arise from the silicification (SiC formation) and the wall thickness decrease resulting from the oxidizing abrasion.

Solution to Problem

In order to accomplish the foregoing objects, the present invention provides a single crystal pulling apparatus comprising: a crucible unit including a crucible and a tray for securing and holding the crucible from below; and a crucible rotating shaft for supporting the tray from below and for elevating and lowering the tray and the crucible while rotating the tray and the crucible, characterized by having a gap portion formed between the crucible and the tray and/or between the tray and the crucible rotating shaft.

Here, the single crystal pulling apparatus according to the present invention also includes a single crystal pulling apparatus in which germanium melt or the like may be accommodated directly in a graphite crucible, in addition to the silicon single crystal pulling apparatus having a quartz crucible for accommodating silicon melt and a graphite crucible for retaining the quartz crucible.

With the above-described configuration, heat escape can be suppressed because the gap portion is formed at least one of between the crucible and the tray and between the tray and the crucible rotating shaft. Specifically, part of the heat quantity transferred from the heater to the crucible escapes out of the furnace through the tray and the crucible rotating shaft. At this time, (1) when the gap portion is formed between the crucible and the tray, the heat escape from the crucible to the tray is suppressed; (2) when the gap portion is formed between the tray and the crucible rotating shaft, the heat escape from the tray to the crucible rotating shaft is suppressed; and (3) when the gap portion is formed between the crucible and the tray and also between the tray and the crucible rotating shaft, both the heat escape from the crucible to the tray and the heat escape from the tray to the crucible rotating shaft are suppressed. Accordingly, the heat conduction in the downward direction from the crucible rotating shaft is reduced in any of the above cases (1) through (3), and as a result, the heat quantity leaking from the crucible rotating shaft to the outside of the furnace can be reduced. Thus, the heat quantity that leaks from the crucible rotating shaft out of the furnace can be reduced by forming the gap portion at least one of between the crucible and the tray and between the tray and the crucible rotating shaft, and as a result, it becomes possible to maintain the heat quantity that is applied to the melt of the metal material, such as silicon, in the crucible, and to keep the temperature in the crucible higher than the melting point of the metal material. In other words, since the heat quantity that leaks from the bottom portion of the crucible rotating shaft is reduced by forming the gap portion, it becomes unnecessary to take the heat loss into account so that the heater does not need to generate a large amount of heat.

In addition, since the gap portion has a greater effect on preventing the heat escape than the low heat conductive member, the present invention can suppress the heat escape more effectively than the conventional example in which the low heat conductive member is interposed in the crucible rotating shaft.

In order to form the gap portion, it is sufficient that, for example, a thin member be interposed on the joint surface between the crucible and the tray and/or on the joint surface between the tray and the crucible rotating shaft. With such a configuration, the component parts of the single crystal pulling apparatus, such as the crucibles, the tray, and the crucible rotating shaft, can be used as they are, and the manufacturing cost can be kept low.

In the present invention, it is preferable that the gap portion formed between the crucible and the tray be positioned below a bottom portion of the crucible.

With the above-described configuration, the amount of heat escape from the bottom portion of the crucible can be lessened. As a result, it is possible to prevent the temperature of the melted material in the bottom portion of the crucible from decreasing, and it is possible to prevent the convection of the melted material that results from the temperature difference from the melted material in an upper portion of the crucible.

In the present invention, it is preferable that the gap portion formed between the tray and the crucible rotating shaft be positioned below a bottom portion of the tray.

With the above-described configuration, the heat transfer from the bottom portion of the tray to the crucible rotating shaft is prevented even if the heat from the bottom portion of the crucible is easily conducted to the tray, so it practically means that the amount of heat escape from the bottom portion of the crucible is lessened. Accordingly, even when the gap portion is formed below the bottom portion of the tray, it is possible to prevent the temperature of the melted material in the bottom portion of the crucible from decreasing, and it is possible to prevent the convection of the melted material that results from the temperature difference from the melted material in an upper portion of the crucible.

In the present invention, it is preferable that a low heat conductive member be interposed at least one of on a joint surface between the crucible and the tray and on a joint surface between the tray and the crucible rotating shaft, the low heat conductive member having a lower heat conductivity in a direction perpendicular to a main surface (i.e., in a thickness direction) than that in the main surface.

With the above-described configuration, the crucible and the tray do not make direct contact with each other, and the tray and the crucible rotating shaft do not make direct contact with each other either. This means that the escaping heat inevitably passes through the low heat conductive member, and as a result, the low heat conductive member suppresses heat conduction. Therefore, the heat escape to the crucible rotating shaft can be delayed, and the heat quantity loss of the crucible can be prevented.

Furthermore, with the configuration in which the low heat conductive member is interposed on the joint surface between the crucible and the tray and/or on the joint surface between the tray and the crucible rotating shaft, it is possible to use the component parts of the single crystal pulling apparatus, such as the crucibles, the tray and the crucible rotating shaft, as they are, and it is unnecessary to process the crucible rotating shaft to form grooves, holes, and the like for interposing the low heat conductive member, unlike the conventional example. Therefore, the manufacturing cost can be kept low.

It should be noted that the low heat conductive member is not particularly limited as long as it can reduce heat conduction. However, it is preferable that the low heat conductive member be made of a material that has sufficient resistance against the compressive stress originating from the weight of the components that are placed thereabove, such as the crucibles and the tray. It is sufficient that the material have substantially the same level of strength as that of the artificial graphite for the crucible and the like, and it is preferable that the material have a compressive strength of 80 MPa or higher. The range of the "low heat conductivity" for the low heat conductive member should be a thermal conductivity coefficient of 10 W/m·K or less under a room temperature condition, preferably 5 W/m·K or less.

In addition, in the present invention, it is preferable that the low heat conductive member comprise a one-dimensional carbon fiber-reinforced carbon composite material or a two-dimensional carbon fiber-reinforced carbon composite material.

The carbon fiber-reinforced carbon composite material has a higher compressive strength along a direction perpendicular to a main surface than a graphite material, 200 MPa or higher in some cases, so it has sufficient resistance against the compressive stress originating from the weight of the components that are placed thereabove, such as the crucibles and the tray. For this reason, the carbon fiber-reinforced carbon composite material is suitable for the raw material for the low heat conductive member according to the present invention. Therefore, any of one-dimensional carbon fiber-reinforced carbon composite material, two-dimensional carbon fiber-reinforced carbon composite material, or three-dimensional carbon fiber-reinforced carbon composite material may be used as the raw material for the low heat conductive member, but preferable is the one-dimensional carbon fiber-reinforced carbon composite material or the two-dimensional carbon fiber-reinforced carbon composite material. The reason is as follows.

Both the one-dimensional carbon fiber-reinforced carbon composite material and the two-dimensional carbon fiber-reinforced carbon composite material can effectively prevent the heat escape from the crucible because both of them have a low thermal conductivity coefficient along a direction perpendicular to a main surface (i.e., a thickness direction of the carbon fiber-reinforced carbon composite material). The three-dimensional carbon fiber-reinforced carbon composite material shows poorer heat insulation effect than the one-dimensional carbon fiber-reinforced carbon composite material and the two-dimensional carbon fiber-reinforced carbon composite material because it has a high thermal conductivity coefficient in the perpendicular direction. Moreover, the three-dimensional carbon fiber-reinforced carbon composite material is extremely high in cost. Accordingly, taking into account the heat insulation effect and the price of the low heat conductive member, it is preferable to use the one-dimensional carbon fiber-reinforced carbon composite material or the two-dimensional carbon fiber-reinforced carbon composite material as the raw material for the low heat conductive member.

In the present invention, it is preferable that the carbon fiber-reinforced carbon composite material be formed in a substantially annular shape.

The shape of the carbon fiber-reinforced carbon composite material may be any shape, such as a circular shape or an annular shape, but an annular shape is preferable. The reason is that when the carbon fiber-reinforced carbon composite material is formed in a substantially annular shape, it is ensured to form the gap portion below the bottom portion of the crucible lower side or below the bottom portion of the tray. Moreover, it becomes possible to secure and support the crucible stably. Furthermore, the contact area is smaller when the carbon fiber-reinforced carbon composite material is in an annular shape than when in a circular shape. Therefore, the heat escape prevention effect can be further enhanced.

The present invention also provides a low heat conductive member used for a single crystal pulling apparatus, characterized by being interposed at least one of on a joint surface between the crucible and the tray and on a joint surface between the tray and the crucible rotating shaft, and being used for suppressing heat conduction from the crucible to the crucible rotating shaft.

In the present invention, it is preferable that the low heat conductive member comprise a one-dimensional carbon fiber-reinforced carbon composite material or a two-dimensional carbon fiber-reinforced carbon composite material.

In addition, it is preferable that the low heat conductive member be formed in a substantially annular shape.

In the single crystal pulling apparatus according to the present invention, it is preferable that the crucible unit comprise: a quartz crucible including a straight trunk portion, a bottom portion, and a curved surface-shaped portion connected from the bottom portion to the straight trunk portion; and a graphite tray for retaining the quartz crucible from below.

By the crucible unit that does not use a graphite crucible as described above, it is made possible to avoid the problems relating to the graphite crucible that arise from the silicification (SiC formation) and the wall thickness decrease resulting from the oxidizing abrasion, which were problems in the past.

In addition, the manufacturing is made easy, and moreover, the cost can be reduced. Specifically, the graphite crucible of the conventional example is manufactured by hollowing-out processing a graphite block into a closed-end cylindrical shape and further finishing-processing the interior thereof. For this reason, the manufacturing has been troublesome. On the other hand, the graphite tray has the advantage that the manufacturing is not troublesome because it has a dish-like shape and does not have a straight trunk portion. In addition, it has another advantage that the cost of the material can be reduced since it does not have the straight trunk portion.

In the present invention, it is preferable that the tray retain at least the bottom portion of the quartz crucible.

It is sufficient that the tray retain at least the bottom portion of the quartz crucible.

In the present invention, it is preferable that the tray retain the bottom portion and the curved surface-shaped portion of the quartz crucible.

With the configuration in which the curved surface-shaped portion of the quartz crucible is retained in addition to the bottom portion as described above, the deformation of the quartz crucible resulting from softening of the quartz crucible can be prevented when it is heated by the heater. Thus, in the single crystal pulling apparatus that uses a later-described interposed member, the risk of contact between the quartz crucible and the interposed member is reduced. As a result, there is no risk that a trouble is caused during the manufacturing process by causing the quartz crucible and the interposed member to make contact with each other.

In the present invention, it is preferable that an outer peripheral surface of the tray and an outer peripheral surface of the straight trunk portion of the quartz crucible be substantially flush with each other. This allows the gap between the quartz crucible and the interposed member to be arranged in a narrower condition easily.

In the present invention, it is preferable that the single crystal pulling apparatus further comprise a crucible unit-heating device for heating the crucible unit, the crucible unit-heating device comprising: a heater disposed so as to surround an outer periphery of the crucible unit; and a cylindrical-shaped interposed member interposed between the crucible unit and the heater, the interposed member made of a carbonaceous material and disposed so as to surround the outer periphery of the crucible unit.

With the above-described configuration, the heat from the heater heats the quartz crucible through the interposed member made of graphite. At this time, because the interposed member has a cylindrical shape without slits, the quartz crucible is heated while variation in heat generation of the heater is alleviated by the interposed member. As a result, the quartz crucible is heated uniformly.

In the present invention, it is preferable that the interposed member be disposed so as to be spaced with a microgap from the quartz crucible.

The size of the microgap M is, for example, from about 1 mm to about 3 mm in the case of using a 22-inch size quartz crucible. The reason is as follows. If the gap is too narrow, the interposed member may make contact with the quartz crucible even when the quartz crucible is deformed very slightly. If the gap is too wide, the heat transfer from the heater may become insufficient.

Advantageous Effects of Invention

According to the present invention, the heat quantity that leaks from the crucible rotating shaft out of the furnace can be reduced by forming the gap portion at least one of between the crucible and the tray mid between the tray and the crucible rotating shaft, and as a result, it becomes possible to maintain the heat quantity that is applied to the melt of the metal material, such as silicon, in the crucible, and to keep the temperature in the crucible higher than the melting point of the metal material. In other words, since the heat quantity that leaks from the bottom portion of the crucible rotating shaft is reduced by forming the gap portion, it becomes unnecessary to take the heat loss into account so that the heater does not need to generate a large amount of heat.

In addition, since the gap portion has a greater effect on preventing the heat escape than the low heat conductive member, the present invention can suppress the heat escape more effectively than the conventional example in which the low heat conductive member is interposed in the crucible rotating shaft.

Furthermore, in order to form the gap portion, it is sufficient that, for example, a thin member be interposed on the joint surface between the crucible and the tray and/or on the joint surface between the tray and the crucible rotating shaft. With such a configuration, the component parts of the single crystal pulling apparatus, such as the crucibles, the tray, and the crucible rotating shaft, can be used as they are, and the manufacturing cost can be kept low.

DESCRIPTION OF EMBODIMENTS

Hereinbelow, the present invention will be described based on the preferred embodiments. It should be noted that the present invention is not limited to the following embodiments.

Embodiment 1

(Embodiment 1-1)
(Configuration of Metal Single Crystal Pulling Apparatus)

Figure 1:
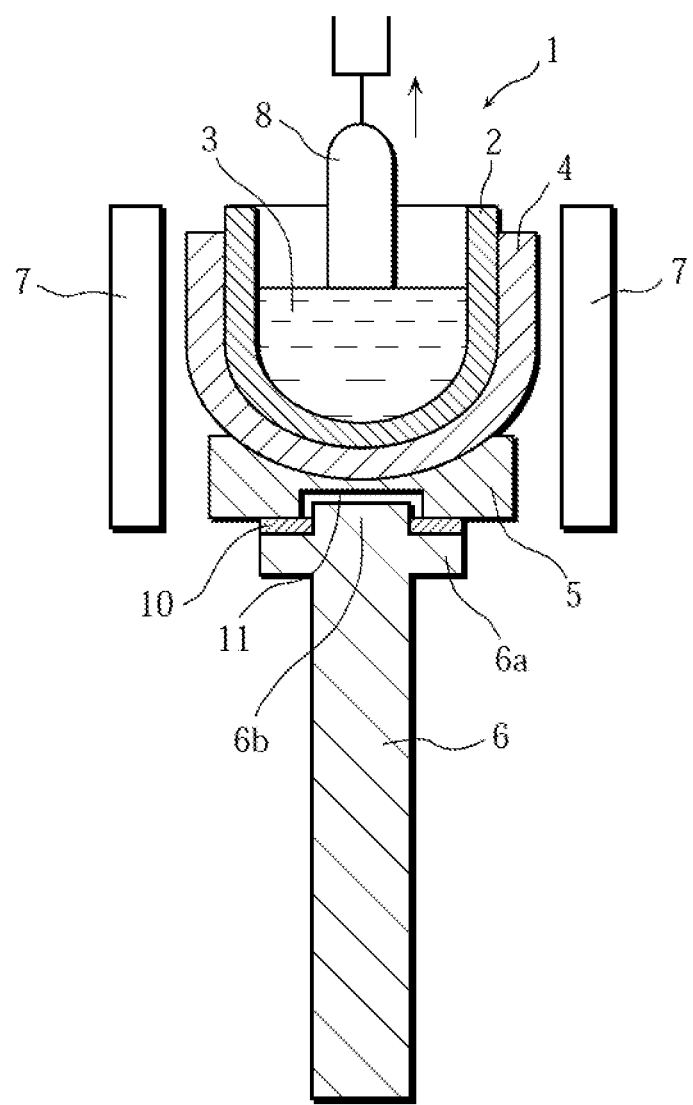
FIG. 1 is a cross-sectional view illustrating a primary portion of a silicon single crystal pulling apparatus according to Embodiment 1-1.
Figure 2:
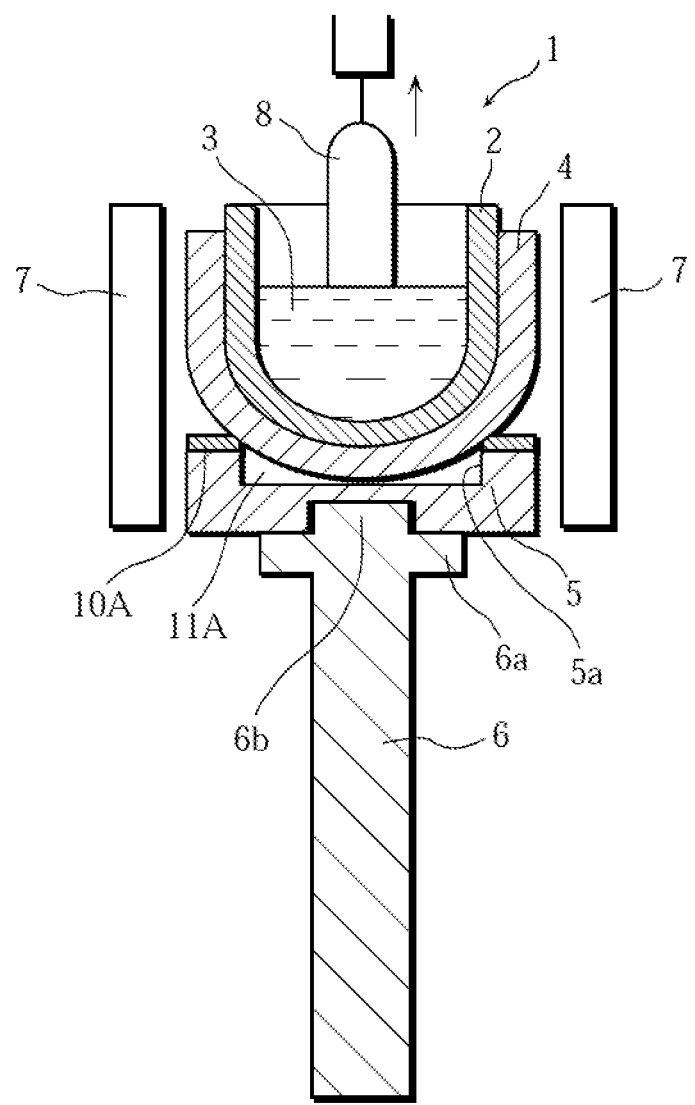
FIG. 2 is a cross-sectional view illustrating a primary portion of a silicon single crystal pulling apparatus according to Embodiment 1-2.

FIG. 1 is a cross-sectional view illustrating a primary portion of a silicon single crystal pulling apparatus according to this embodiment 1-1. In the figure, reference numeral 1 represents a single crystal pulling apparatus, reference numeral 2 represents a quartz crucible for accommodating silicon melt 3, reference numeral 4 represents a graphite crucible for retaining the quartz crucible 2, reference numeral 5 represents a graphite tray for securing and holding the graphite crucible 4 from below, and reference numeral 6 represents a crucible rotating shaft made of graphite, for supporting the tray 5 from below and elevating and lowering the tray 5 and the crucibles 2, 4 while rotating the tray 5 and the crucibles 2, 4. The quartz crucible 2, the graphite crucible 4, and the graphite tray 5 constitute a crucible unit. The crucible rotating shaft 6 is controlled by a rotating/elevating and lowering drive device (not shown) so as to rotate freely. The crucible rotating shaft 6 rotates the tray 5, the graphite crucible 4 and the quartz crucible 2 about the rotation axis which is the pulling axis of silicon single crystal, and also moves them upward, so as to keep the level of the silicon melt 3 at a predetermined height. A heater 7 is disposed around the outer periphery of the graphite crucible 4. The silicon melt 3 is heated by the heater 7 through the graphite crucible 4 and the quartz crucible 2, and an ingot 8 is pulled up to produce a silicon single crystal.

What should be noted here is that a low heat conductive member 10 is interposed on a joint surface between the tray 5 and the crucible rotating shaft 6. Specifically the low heat conductive member 10 is interposed between the lower face of the bottom portion of the tray 5 and the upper face of a flange portion 6a of the crucible rotating shaft 6. The low heat conductive member 10 is formed in a substantially tubular shape and is interposed in such a manner that a protruding portion 6b of the crucible rotating shaft 6 is inserted through the center hole of the low heat conductive member 10. Thereby a gap portion 11 is formed below the bottom portion of the tray 5.

The low heat conductive member 10 comprises a two-dimensional carbon fiber-reinforced carbon composite material. For the carbon fiber-reinforced carbon composite material, it is possible to use any of one-dimensional carbon fiber-reinforced carbon composite material, two-dimensional carbon fiber-reinforced carbon composite material, or three-dimensional carbon fiber-reinforced carbon composite material. However, it is preferable to use the one-dimensional carbon fiber-reinforced carbon composite material or the two-dimensional carbon fiber-reinforced carbon composite material, and it is more preferable to use the two-dimensional carbon fiber-reinforced carbon composite material. The reason is as follows.

It is necessary to take into consideration that the raw material for the low heat conductive member 10 has sufficient strength, has a low thermal conductivity coefficient, and is low in cost, for example.

The three-dimensional carbon fiber-reinforced carbon composite material has a higher thermal conductivity coefficient, thus lower heat insulation effect, than the two-dimensional carbon fiber-reinforced carbon composite material in a vertical direction (i.e., the crucible rotation axis direction in the present embodiment). Moreover, the cost is high. For these reasons, it is more preferable to use the two-dimensional carbon fiber-reinforced carbon composite material than the three-dimensional carbon fiber-reinforced carbon composite material. On the other hand, the one-dimensional carbon fiber-reinforced carbon composite material has almost the same degree of heat insulation effect as the two-dimensional carbon fiber-reinforced carbon composite material, and the cost thereof is also almost the same level as that of the two-dimensional carbon fiber-reinforced carbon composite material. Nevertheless, the one-dimensional carbon fiber-reinforced carbon composite material tends to crack easily when it is formed in an annular shape. Accordingly, when the low heat conductive member 10 is formed in a disk shape, the one-dimensional carbon fiber-reinforced carbon composite material may be used as the raw material for the low heat conductive member 10, but when the low heat conductive member 10 is formed in an annular shape, it is preferable to use the two-dimensional carbon fiber-reinforced carbon composite material.

The thickness of the low heat conductive member 10 made of the two-dimensional carbon fiber-reinforced carbon composite material is set to 3 mm to 10 mm. When the low heat conductive member is thicker, the heat insulation effect is greater because heat conduction becomes lower. However, when a practical range is taken into consideration, it is preferable that the thickness be within the range of 3 mm to 10 mm.

The size of the gap portion 11 is 2 mm or greater preferably 3 mm or greater, and more preferably 5 mm or greater. Nevertheless, if the size thereof is too great, stability of the crucible becomes worse, so it is preferable that the size be less than 50 mm.

Next, a method of manufacturing a silicon single crystal using the single crystal pulling apparatus with the above-described configuration will be described below.

First, polycrystalline silicon is placed in the quartz crucible 2, and thereafter heat is generated by the heater 7 to heat the quartz crucible 2 via the graphite crucible 4. Thereby, the polycrystalline silicon in the quartz crucible 2 is heated to a temperature higher than the melting point of silicon to melt it. Next, a seed crystal attached to a seed chuck is lowered and immersed in the silicon melt 3, which has been melted, and thereafter, while rotating the seed chuck and the graphite crucible 4 in the same direction or in opposite directions, the seed chuck is pulled up to grow a silicon crystal.

Here, the graphite crucible 4 is heated by the heater 7, but the heat quantity of the graphite crucible 4 is transferred from the graphite crucible 4, then to the tray 5, and then to the crucible rotating shaft 6, so the heat tends to escape from a lower portion of the crucible rotating shaft 6 out of the furnace. However, since the gap portion 11 is formed below the bottom portion of the tray 5, the heat escape from the bottom portion of the tray 5 to the crucible rotating shaft 6 is suppressed. As a result, the heat escape from the tray 5 to the crucible rotating shaft 6 is mainly through the low heat conductive member 10. Here, the low heat conductive member 10 comprises a two-dimensional carbon fiber-reinforced carbon composite material and has a lower thermal conductivity coefficient than the graphite material, so the transfer of the heat from the tray 5 to the crucible rotating shaft 6 is suppressed. Thereby, the heat escape to the crucible rotating shaft 6 can be delayed, and the heat quantity loss of the crucible can be prevented. Moreover, since the escape of the heat of the bottom portion of the graphite crucible 4 is difficult, the temperature uniformity in the bottom portions of the crucibles 4 and 2 becomes favorable. Therefore, it becomes possible to suppress the convection of the silicon melt that results from the temperature difference from the crucible upper region.

(Embodiment 1-2)

Figure 3:
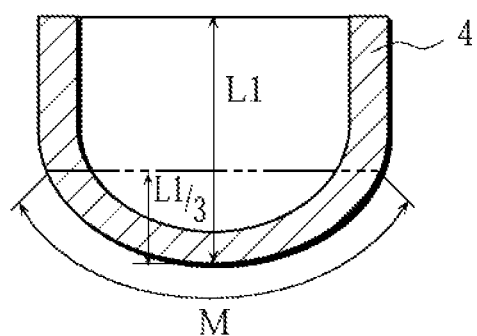
FIG. 3 is a view for illustrating a crucible bottom portion.

FIG. 3 is a cross-sectional view illustrating a primary portion of a silicon single crystal pulling apparatus according to Embodiment 1-2. This embodiment 1-2 is characterized in that a gap portion 11A is formed below the bottom portion of the graphite crucible 4 and a low heat conductive member 10A is interposed on a joint surface between the graphite crucible 4 and the tray 5. While the foregoing embodiment 1-1 is characterized by the heat insulating structure between the tray 5 and the crucible rotating shaft 6, this embodiment 1-2 is characterized by the heat insulating structure between the graphite crucible 4 and the tray 5. Hereinbelow, a specific structure of this embodiment 1-2 will be described. In the present embodiment, the low heat conductive member 10A in a substantially tubular shape is interposed on the joint surface between the graphite crucible and the tray 5. Specifically, the low heat conductive member 10A is interposed between a face of the bottom portion of the graphite crucible 4 that is closer to outside and the upper face of the bottom portion of the tray 5. The center hole of the low heat conductive member 10A has such a size as to substantially correspond to a recessed portion 5a of the tray 5 so that the bottom portion of the graphite crucible 4 fits in the center hole and faces the bottom face of the recessed portion 5a. Thereby, the gap portion 11A is formed below the bottom portion of the graphite crucible 4.

Here, the term "the bottom portion of the graphite crucible 4" in the present specification is used in the following sense. As illustrated in FIG. 3, it means a region M in which the vertical length from the bottommost part of the graphite crucible 4 at an outer peripheral side is ⅓L, where the length from the bottommost part of the graphite crucible 4 to the upper end of the crucible is L1.

In the present embodiment, there is no region in which the graphite crucible 4 and the tray 5 are in direct contact with each other, so the heat of the graphite crucible 4 is not easily transferred to the tray 5. Accordingly, the heat escape to the crucible rotating shaft 6 can be delayed, and the heat quantity loss of the graphite crucible 4 can be prevented. Moreover, since the escape of the heat of the bottom portion of the graphite crucible 4 is difficult, the temperature uniformity in the bottom portions of the crucibles 4 and 2 becomes favorable. Therefore, it becomes possible to suppress the convection of the silicon melt that results from the temperature difference from the crucible upper region.

(Embodiment 1-3)

Figure 4:
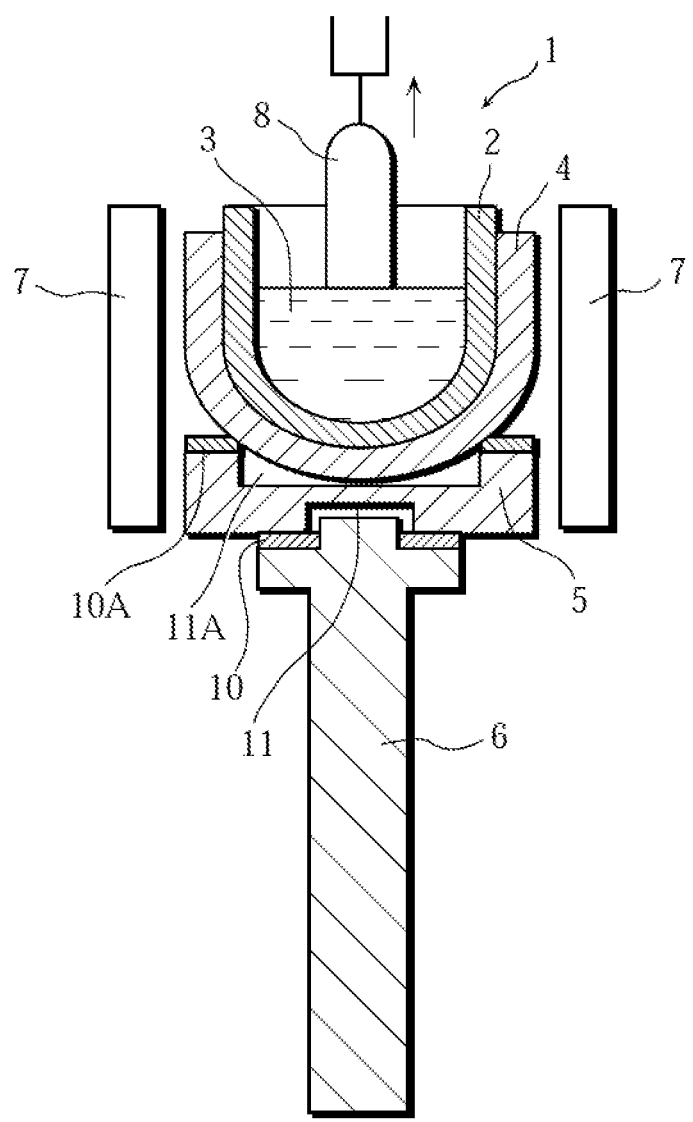
FIG. 4 is a cross-sectional view illustrating a primary portion of a silicon single crystal pulling apparatus according to Embodiment 1-3.

FIG. 4 is a cross-sectional view illustrating a primary portion of a silicon single crystal pulling apparatus according to Embodiment 1-3. This embodiment 3 is characterized by having both the heat insulating structure between the tray 5 and the crucible rotating shaft 6 and the heat insulating structure between the graphite crucible 4 and the tray 5. In other words, this embodiment 1-3 has a structure in which the foregoing embodiment 1-1 and the foregoing embodiment 1-2 are combined.

Hereinbelow, a specific structure of this embodiment 1-3 will be described. The low heat conductive member 10A is interposed on the joint surface between the graphite crucible 4 and the tray 5, whereby the gap portion 11 A is formed below the bottom portion of the graphite crucible 4. In addition, the low heat conductive member 10 in a substantially tubular shape is interposed on the joint surface between the tray 5 and the crucible rotating shaft 6, whereby the gap portion 11 is formed below the bottom portion of the tray 5. Such a structure achieves a heat insulation effect between the tray 5 and the crucible rotating shaft 6 and a heat insulation effect between the graphite crucible 4 and the tray 5. Therefore, the heat quantity loss of the crucible can be prevented further.

(Other Embodiments)

(1) In the foregoing embodiments 1-1 through 1-3, explanations have been provided about the single crystal pulling apparatus having a quartz crucible for accommodating silicon melt and a graphite crucible for retaining the quartz crucible. However, the present invention can be applied to a single crystal pulling apparatus that does not have the quartz crucible but accommodates germanium melt or the like directly in the graphite crucible.

(2) In the foregoing embodiments 1-1 through 1-3, the low heat conductive member in an annular shape is one that is integrally formed. However the low heat conductive member may be formed in an annular shape by a combination of a plurality of members. In addition, the low heat conductive member may be constructed by a plurality of members spaced at a gap along a circumferential direction. Nevertheless, the low heat conductive member that is integrally formed in an annular shape, as in the foregoing embodiments 1 through 3, is more preferable. The reason is that it is sufficient to use only one member, so handling becomes easier.

(3) Although the low heat conductive member is formed in an annular shape, it may be formed in a disk shape. Nevertheless, it is more preferable that the low heat conductive member be in an annular shape. The reason is that when the low heat conductive member is in an annular shape, it is ensured to for the gap portion below the bottom portion of the graphite crucible and below the bottom portion of the tray, and moreover, the crucible can be secured and supported stably.

(4) It appears possible to use an expanded graphite sheet or a heat insulating material in place of the low heat conductive member comprising the two-dimensional carbon fiber-reinforced carbon composite material. However, the expanded graphite sheet and the heat insulating material have insufficient strength, and therefore they are inadequate.

(5) It appears that when the tray itself is formed of a carbon fiber-reinforced carbon composite material, substantially the same level of heat insulation effect as the present invention can be obtained. However, there is no such two-dimensional carbon fiber-reinforced carbon composite material as thick as to be made into the tray. In addition, if the tray is made by laminating commercially available two-dimensional carbon fiber-reinforced carbon composite materials, the cost will be extremely high, so it will be impractical in terms of cost. Moreover, even if the production is possible, combinations with the graphite crucible cause the problem that the difference in thermal conductivity coefficient is so large that they interfere with each other and the tray easily cracks. Such problems also arise in the case that the crucible rotating shaft is formed of a carbon fiber-reinforced carbon composite material. On the other hand, such problems do not arise in the present invention.

Embodiment 2

Figure 5:
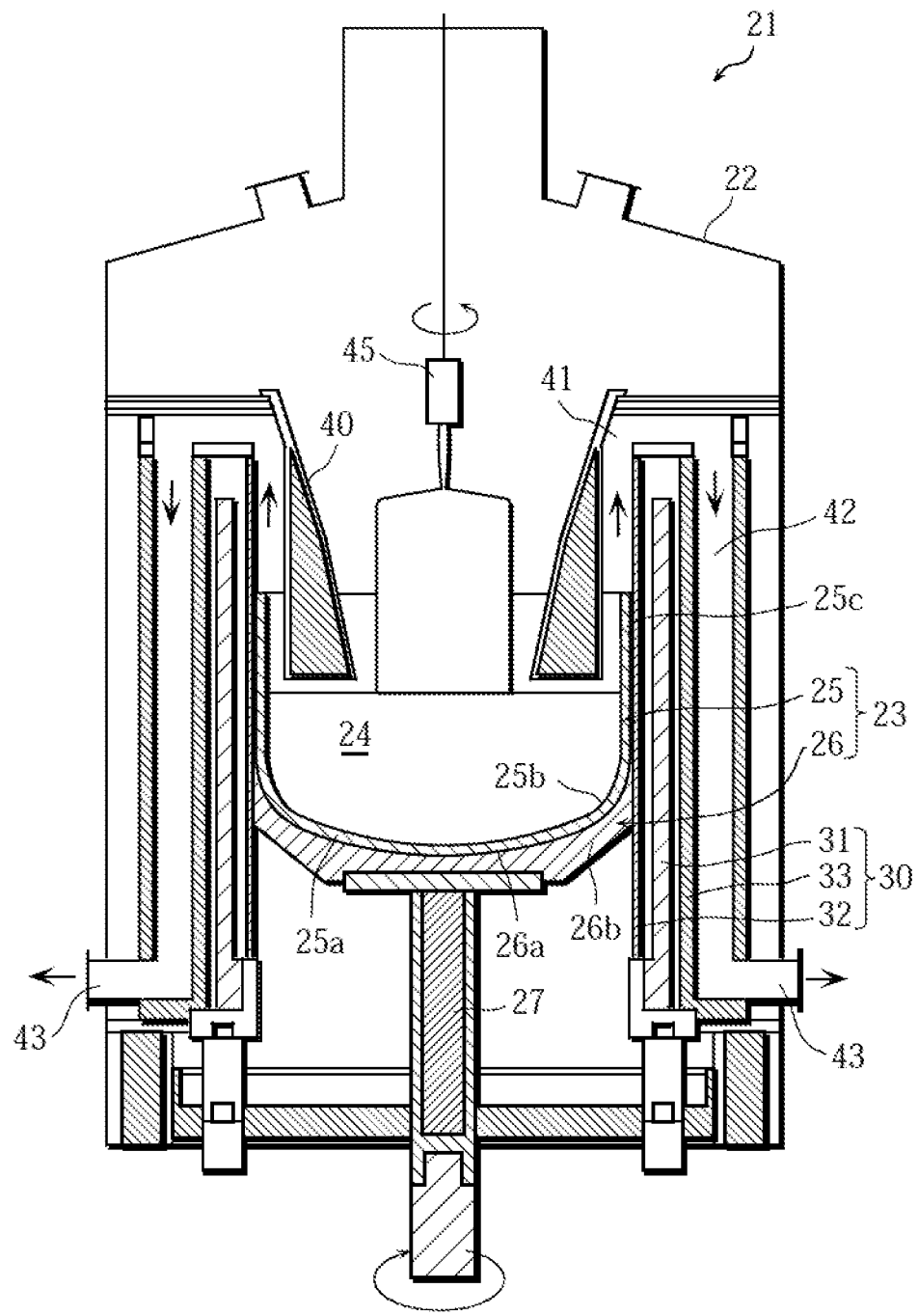
FIG. 5 is a cross-sectional view illustrating a primary portion of a silicon single crystal pulling apparatus according to Embodiment 2.
Figure 6:
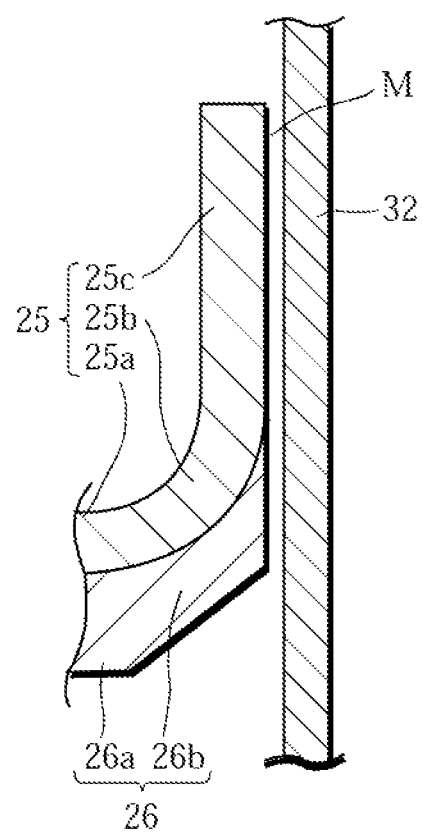
FIG. 6 is a cross-sectional view illustrating a portion of FIG. 5 enlarged.

FIG. 5 is a cross-sectional view illustrating a primary portion of a silicon single crystal pulling apparatus according to this embodiment 2, and FIG. 6 is a cross-sectional view illustrating a portion of FIG. 5 enlarged. A single crystal pulling apparatus 21 has a CZ furnace (chamber) 22 serving as a container for single crystal pulling. A crucible unit 23 is provided in the CZ furnace 22. The crucible unit 23 comprises a quartz crucible 25 for melting a polycrystalline silicon raw material and accommodating it in the form of melt 24, and a graphite tray 26 for retaining the quartz crucible 25 from below. Thus, the crucible unit 23 according to the present embodiment uses the graphite tray 26 in place of the graphite crucible provided in the crucible unit of conventional examples. Using the crucible unit 23 that does not use the graphite crucible in this way makes it possible to avoid the problems relating to the graphite crucible that arise from the silicification (SiC formation) and the wall thickness decrease resulting from the oxidizing abrasion. This point will be described later in detail.

A crucible rotating shaft 27 is provided below the crucible unit 23. The crucible rotating shaft 27 supports the tray 26 from below, and elevates and lowers the tray 26 and the quartz crucible 25 while rotating the tray 26 and the quartz crucible 25. The crucible rotating shaft 27 is controlled by a rotating/elevating and lowering drive device (not shown) so as to rotate freely. The crucible rotating shaft 27 rotates the tray 26 and the quartz crucible 25 about the rotation axis which is the pulling axis of silicon single crystal, and also moves them upward, so as to keep the level of the silicon melt 24 at a predetermined height.

A heating device 30 is provided at the outer peripheral side of the crucible unit 23. The heating device 30 has: a cylindrical-shaped graphite heater 31 disposed so as to surround the outer periphery of the crucible unit; a cylindrical-shaped graphite interposed member 32 interposed between the crucible unit 23 and the heater 31 and disposed so as to surround the outer periphery of the crucible unit 23; and a heat shielding member 33. The interposed member 32 is an isotropic graphite material or a carbon fiber-reinforced carbon material (C/C material), and is disposed so as to be spaced with a microgap M from the quartz crucible 25. The size of the microgap M is from about 1 mm to about 3 mm in the case of using a 22-inch size quartz crucible 25. The reason is as follows. If the gap is too narrow, the interposed member may make contact with the quartz crucible 25 even when the quartz crucible 25 is deformed very slightly. If the gap is too wide, the heat transfer from the heater 31 may become insufficient. It should be noted that the interposed member 32 also serves to retain the quartz crucible 25 supplementarily. Specifically, in such a case that the quartz crucible 25 has been deformed beyond the microgap M due to some trouble, the quartz crucible 25 is retained by the interposed member 32 so that stability of the quartz crucible 25 can be maintained at all times.

Next, the structures and workings of the tray 26 and the interposed member 32 will be described in detail.

The quartz crucible 25 has substantially a cup-like shape, and it comprises a bottom portion 25a, a straight trunk portion 25c, and a curved surface-shaped portion (curved portion) 25b connected from the bottom portion 25a to the straight trunk portion 25c. The tray 26 comprises a first tray portion 26a for retaining the bottom portion 25a and a second tray portion 26b for retaining the curved surface-shaped portion 25b. Since the curved surface-shaped portion 25b of the quartz crucible 25 is retained by the tray 26 in this way, the deformation of the quartz crucible 25 resulting from softening of the quartz crucible 25 is suppressed when it is heated by the heater 31, and the risk of contact with the interposed member 32 is reduced.

In addition, the outer peripheral surface of the second tray portion 26b of the tray 26 is substantially flush with the outer peripheral surface of the straight trunk portion 25c of the quartz crucible 25. This makes it easy to form the microgap M.

By providing the tray 26 and the interposed member 32 having the configuration as described above, it is made possible to avoid the problems relating to the graphite crucible that arise from the silicification (SiC formation) and the wall thickness decrease resulting from the oxidizing abrasion. Specifically, when compared to the graphite crucible in conventional examples, the tray 26 may be regarded as a structure that eliminates the straight trunk portion of the graphite crucible and has only the bottom portion. Various problems with the graphite crucible in the conventional examples are mainly due to the presence of the straight trunk portion of the graphite crucible. Therefore, the crucible unit 23 according to the present embodiment, which uses the tray 26 that can be regarded as eliminating the straight trunk portion of the graphite crucible and having only the bottom portion thereof, makes it possible to avoid the problems relating to the graphite crucible that arise from the silicification (SiC formation) and the wall thickness decrease resulting from the oxidizing abrasion. That is, because the quartz crucible 25 is not in contact with the surrounding graphite parts, it becomes possible to avoid the problems relating to the graphite crucible that arise from the silicification (SiC formation) and the wall thickness decrease resulting from the oxidizing abrasion.

In addition, because the interposed member 32 has a cylindrical shape and does not have any slit, the quartz crucible 25 is heated by radiant heat after the interposed member 32 alleviates variation in heat generation of the heater 31. Therefore, the quartz crucible 25 is heated uniformly. As a result, stability of the quality of metal crystal can be maintained. For reference, the graphite crucible of conventional examples generally has a structure in which it is divided into two or three parts, so it has slits at the divided portions. This causes the problem that the quartz crucible is not uniformly heated due to the slits, inhibiting stability of the quality of the metal crystal. The present embodiment resolves such a problem by using the interposed member 32.

Moreover, using the graphite tray 26 in place of the graphite crucible serves to make the manufacturing easy and reduce the cost. Specifically, the graphite crucible of the conventional example is manufactured by hollowing-out processing a graphite block into a closed-end cylindrical shape and further finishing-processing the interior thereof. For this reason, the manufacturing has been troublesome. On the other hand, the graphite tray 26 has the advantage that the manufacturing is not troublesome because it has a dish-like shape and does not have a straight trunk portion. In addition, it has another advantage that the cost of the material can be reduced since it does not have the straight trunk portion.

The inside of the CZ furnace 22 is kept to be a vacuum by shutting off the inside of the CZ furnace 22 from the external air. That is, the inside of the CZ furnace 22 is supplied with argon gas as an inert gas, and the gas is exhausted by a pump from a gas exhaust port 43 of the inside of the CZ furnace 22. Thereby, the pressure inside the CZ furnace 22 is reduced to a predetermined pressure. Also, during a process of single crystal pulling (1 batch), various kinds of vaporized substances are produced in the CZ furnace 22. In view of that, argon gas is supplied into the CZ furnace 22 and discharged out of the CZ furnace 22 together with the vaporized substances, to remove the vaporized substances from the inside of the CZ furnace 22 to keep it clean.

Figure 10:
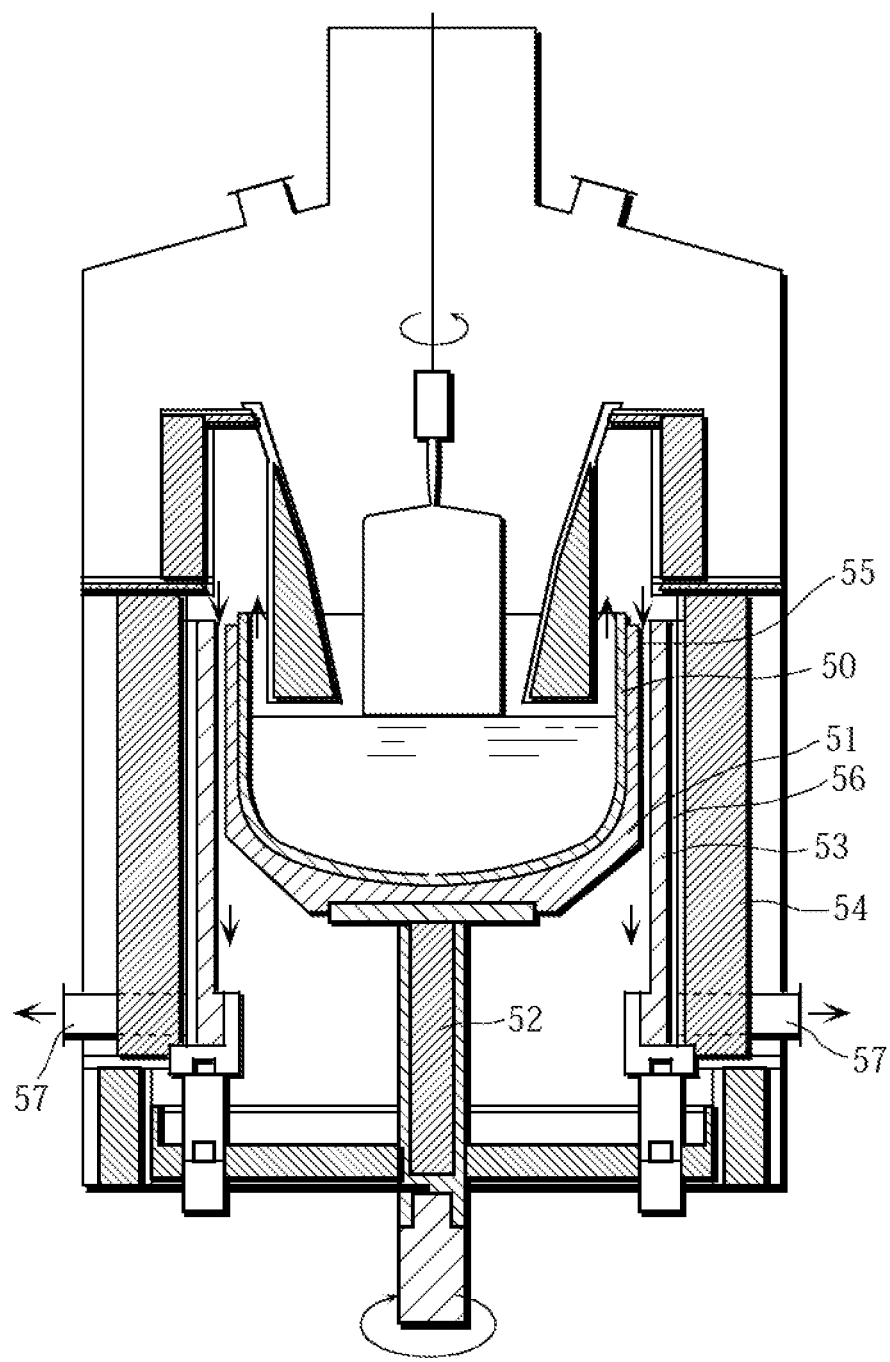
FIG. 10 is a cross-sectional view illustrating a primary portion of a conventional silicon single crystal pulling apparatus.

In addition, a heat shielding member 40 in a substantially reversed truncated conical shape is provided above the quartz crucible 25. The heat shielding member 40 guides the argon gas as the carrier gas, which is supplied from above into the CZ furnace 22, to the center of the surface of the melt 24, then allows it to flow along the surface of the melt 24, and guides it to the peripheral portion of the surface of the melt 24. Then, the argon gas is allowed to flow through passages 41 and 42 together with the gases that have evaporated from the melt, such as SiO, and is discharged through the gas exhaust port 43 provided at a lower portion of the CZ furnace 22. With such a configuration, the following advantage is obtained. The SiO gas is sucked to a position higher than the upper end of the heater 31 in a hot zone, thereafter is allowed to pass through the outside of the hot zone and then flow toward the gas exhaust port 43. Thus, unlike the conventional example shown in FIG. 10, the gases do not pass through the space between the graphite crucible and the heater aid the space between the heater and the heat shielding member. So the reaction between the SiO gas and the graphite members is suppressed, and the use life of the graphite members (the heater 31, the heat shielding member 33, and the like) is extended.

Next, a method of manufacturing a silicon single crystal using the single crystal pulling apparatus with the above-described configuration will be described below. First, polycrystalline silicon is placed in the quartz crucible 5, and thereafter heat is generated by the heater 30 to heat the quartz crucible 25 via the interposed member 32. Thereby, the polycrystalline silicon in the quartz crucible 25 is heated to a temperature higher than the melting point of silicon to melt it. Next, a seed crystal attached to a seed chuck 45 is lowered and immersed in the silicon melt 24, which has been melted, and thereafter, while rotating the seed chuck 45 and the crucible unit 23 in the same direction or in opposite directions, the seed chuck 45 is pulled up to produce a silicon crystal.

Embodiment 3

(Embodiment 3-1)

Figure 7:
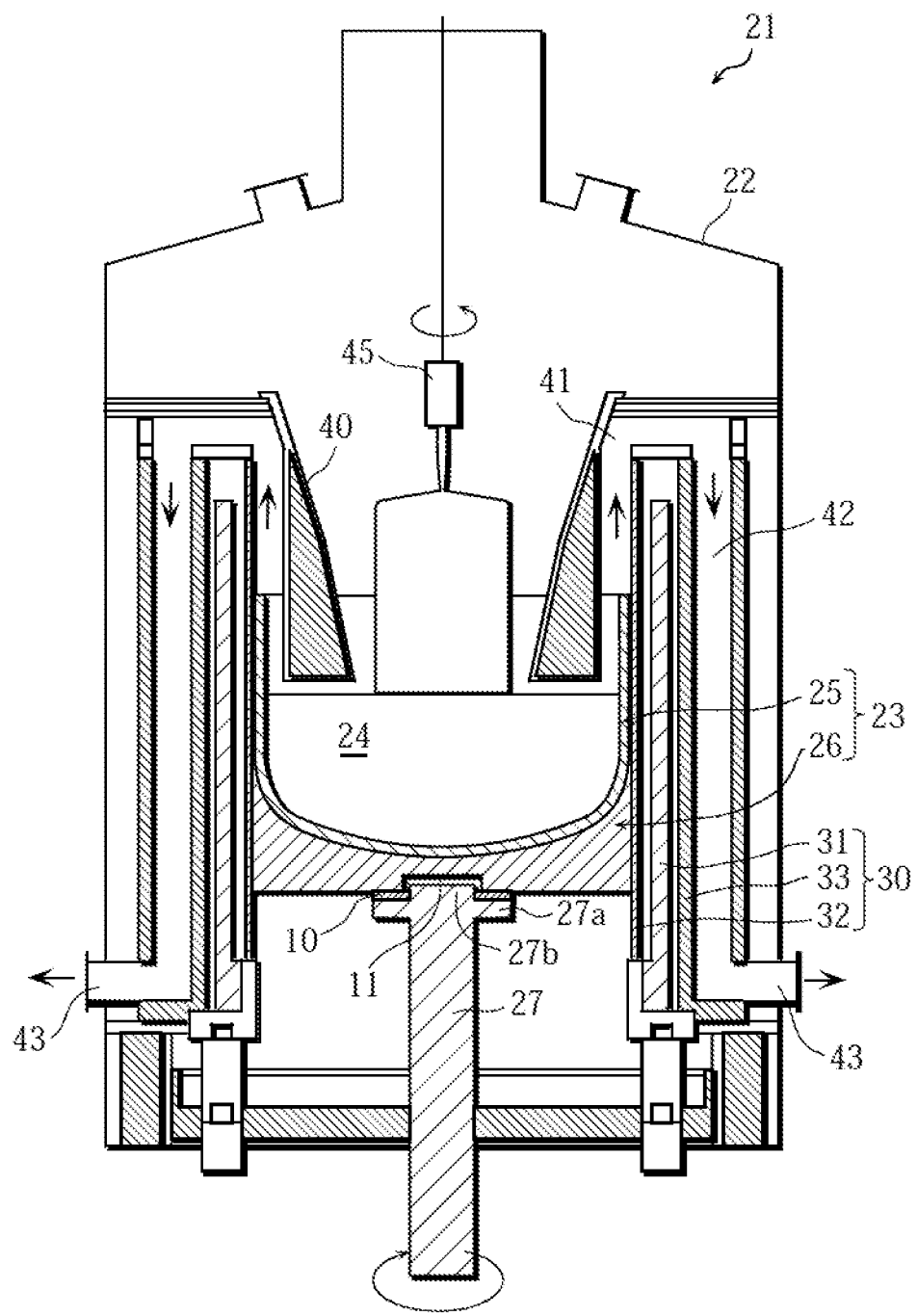
FIG. 7 is a cross-sectional view illustrating a primary portion of a silicon single crystal pulling apparatus according to Embodiment 3-1.

This embodiment 3-1 is a combination of the foregoing embodiment 2 and the foregoing embodiment 1-1. Specifically, as illustrated in FIG. 7, the low heat conductive member 10 is interposed on the joint surface between the tray 26 and the crucible rotating shaft 27. Specifically, the low heat conductive member 10 is interposed between the lower face of the bottom portion of the tray 26 and the upper face of a flange portion 27a of the crucible rotating shaft 27. The low heat conductive member 10 is formed in a substantially tubular shape and is interposed in such a manner that a protruding portion 27b of the crucible rotating shaft 27 is inserted through the center hole of the low heat conductive member 10. Thereby, the gap portion 11 is formed below the bottom portion of the tray 26. With the above-described configuration, as with the foregoing embodiment 1-1, the heat escape from the bottom portion of the tray 26 to the crucible rotating shaft 27 is suppressed because of the presence of the gap portion 11, and moreover, the heat transfer from the tray 26 to the crucible rotating shaft 27 is suppressed because of the presence of the low heat conductive member 10.

(Embodiment 3-2)

Figure 8:
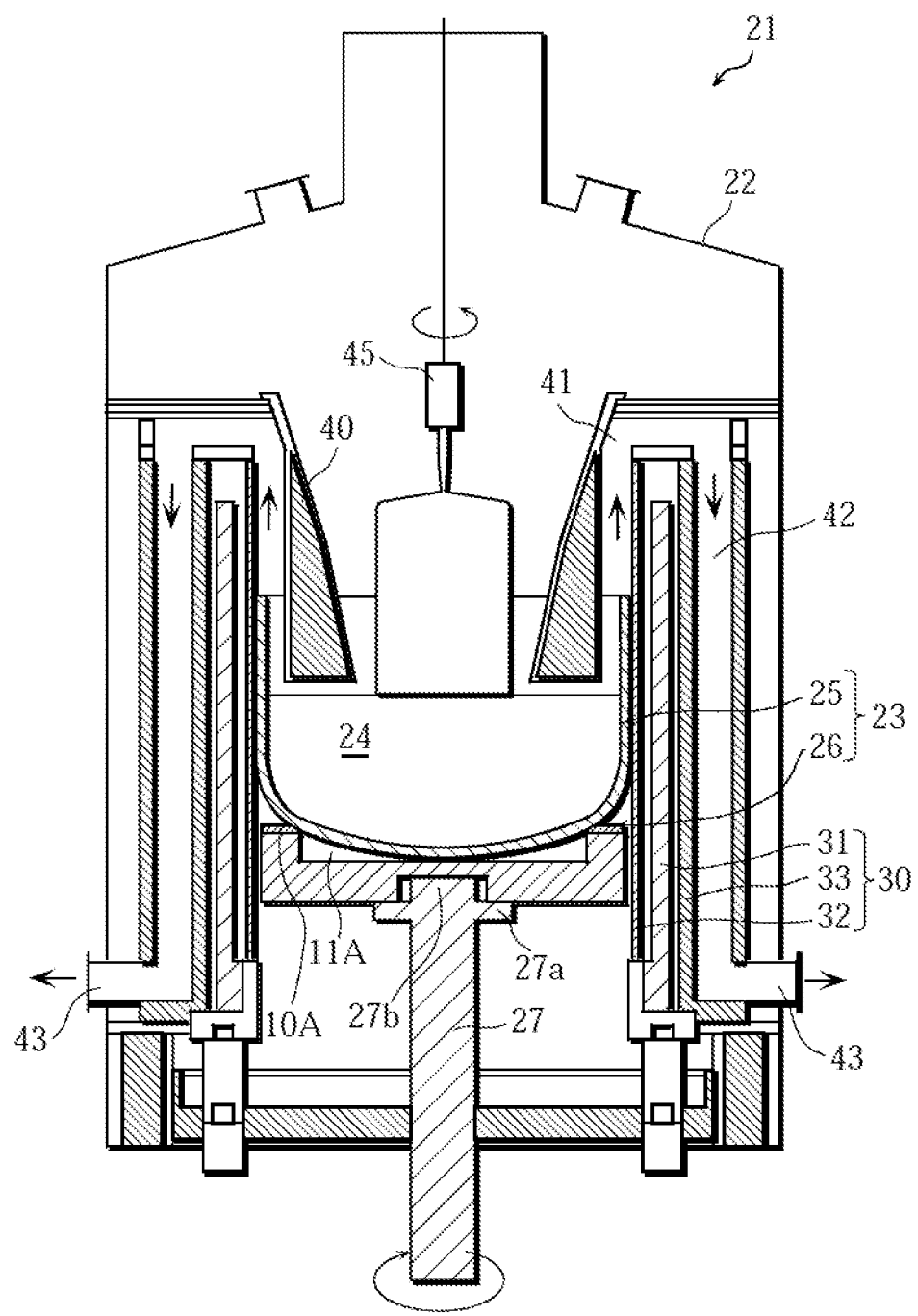
FIG. 8 is a cross-sectional view illustrating a primary portion of a silicon single crystal pulling apparatus according to Embodiment 3-2.

This embodiment 3-2 is a combination of the foregoing embodiment 2 and the foregoing embodiment 1-2. Specifically, as illustrated in FIG. 8, the gap portion 11A is formed below the bottom portion of the quartz crucible 25 and the low heat conductive member 10A is interposed on the joint surface between the quartz crucible 25 and the tray 26. With the above-described configuration, as with the foregoing embodiment 1-2, there is no region in which the quartz crucible 25 and the tray 26 are in direct contact with each other, so the heat of the quartz crucible 25 is not easily transferred to the tray 26. Accordingly the heat escape to the crucible rotating shaft 27 can be delayed, and the heat quantity loss of the quartz e crucible 25 can be prevented. Moreover, since the escape of the heat of the bottom portion of the quartz crucible 25 is difficult, the temperature uniformity in the bottom portions of the quartz crucible 25 becomes favorable. Therefore, it becomes possible to suppress the convection of the silicon melt that results from the temperature difference from the crucible upper region.

(Embodiment 3-3)

Figure 9:
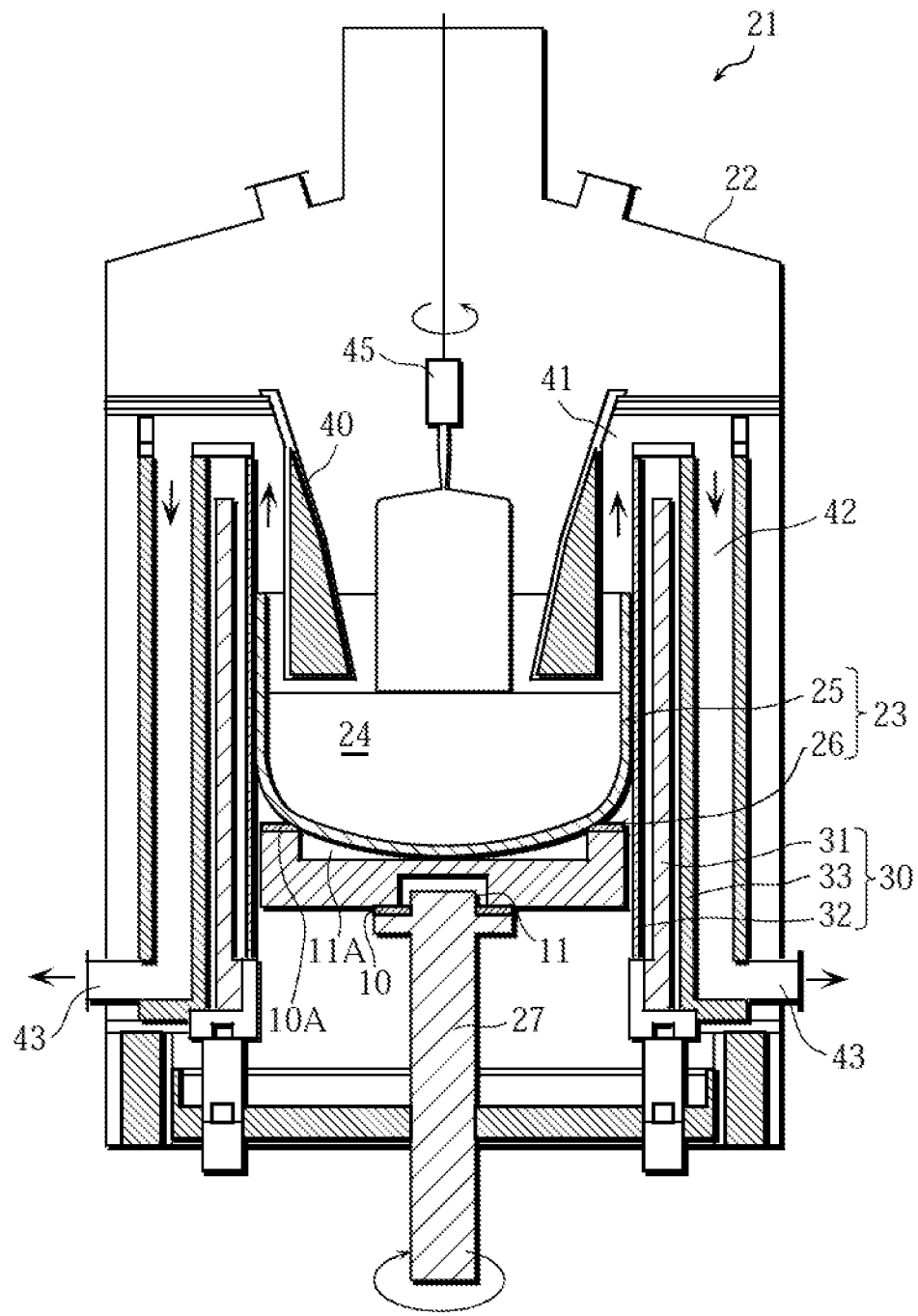
FIG. 9 is a cross-sectional view illustrating a primary portion of a silicon single crystal pulling apparatus according to Embodiment 3-3.

This embodiment 3-3 is a combination of the foregoing embodiment 2 and the foregoing embodiment 1-3. That is, this embodiment 3-3 is characterized by having both the heat insulating structure between the tray 26 and the crucible rotating shaft 27 and the heat insulating structure between the quartz crucible 25 and the tray 26. Specifically as illustrated in FIG. 9, the low heat conductive member 10A in a substantially tubular shape is interposed on the joint surface between the quartz crucible 25 and the tray 26, whereby the gap portion 11A is formed below the bottom portion of the quartz crucible 25. In addition, the low heat conductive member 10 in a substantially tubular shape is interposed on the joint surface between the tray 26 and the crucible rotating shaft 27, whereby the gap portion 11 is formed below the bottom portion of the tray 26. Such a structure achieves a heat insulation effect between the tray 26 and the crucible rotating shaft 27 and a heat insulation effect between the quartz crucible 25 and the tray 26. Therefore, the heat quantity loss of the crucible can be prevented further.

INDUSTRIAL APPLICABILITY

The present invention is applicable to single crystal pulling apparatus for silicon or the like.

Reference Signs List

1—Single crystal pulling apparatus
2—Quartz crucible
3—Silicon melt
4—Graphite crucible
5—Tray
6—Crucible rotating shaft
10, 10A—Low heat conductive member
11, 11A—Gap portion
21—Single crystal pulling apparatus
22—CZ furnace
23—Crucible unit
25—Quartz crucible
25a—Bottom portion of quartz crucible
25b—Curved surface-shaped portion (curved portion) of quartz crucible
25c—Straight trunk portion of quartz crucible
26—Graphite tray
26a—First tray portion
26b—Second tray portion
27—Crucible rotating shaft
30—Heating device 31—Heater
32—Interposed member
M—Microgap

The invention claimed is:

1. A single crystal pulling apparatus comprising: a crucible unit including a crucible and a tray for securing and holding the crucible from below; and a crucible rotating shaft for supporting the tray from below and for elevating and lowering the tray and the crucible while rotating the tray and the crucible, wherein the single crystal pulling apparatus has a gap portion formed by interposing a low heat conductive member for suppressing heat conduction from the crucible to the crucible rotating shaft at least one of on a joint surface between the crucible and the tray and on a joint surface between the tray and the crucible rotating shaft, so that at least one of (i) the crucible and the tray do not make direct contact with each other and (ii) the tray and the crucible rotating shaft do not make direct contact with each other.

2. The single crystal pulling apparatus according to claim 1, wherein the gap portion formed between the crucible and the tray is positioned below a bottom portion of the crucible.

3. The single crystal pulling apparatus according to claim 1, wherein the gap portion formed between the tray and the crucible rotating shaft is positioned below a bottom portion of the tray.

4. The single crystal pulling apparatus according to claim 1, wherein the low heat conductive member has a lower heat conductivity in a direction perpendicular to a main surface than that in the main surface.

5. The single crystal pulling apparatus according to claim 4, wherein the low heat conductive member comprises a one-dimensional carbon fiber-reinforced carbon composite material or a two-dimensional carbon fiber-reinforced carbon composite material.

6. The single crystal pulling apparatus according to claim 5, wherein the carbon fiber-reinforced carbon composite material is formed in a substantially annular shape.

7. The low heat conductive member according to claim 1, wherein the low heat conductive member comprises a one-dimensional carbon fiber-reinforced carbon composite material or a two-dimensional carbon fiber-reinforced carbon composite material.

8. The low heat conductive member according to claim 7, wherein the low heat conductive member is formed in a substantially annular shape.

9. The single crystal pulling apparatus according to claim 1, wherein the crucible unit comprises: a quartz crucible including a straight trunk portion, a bottom portion, and a curved surface-shaped portion connected from the bottom portion to the straight trunk portion; and a graphite tray for retaining the quartz crucible from below.

10. The single crystal pulling apparatus according to claim 9, wherein the tray retains at least the bottom portion of the quartz crucible.

11. The single crystal pulling apparatus according to claim 10, wherein the tray retains the bottom portion and the curved surface-shaped portion of the quartz crucible.

12. The single crystal pulling apparatus according to claim 11, wherein an outer peripheral surface of the tray and an outer peripheral surface of the straight trunk portion of the quartz crucible are substantially flush with each other.

13. A single crystal pulling apparatus according to claim 9, further comprising:
a crucible unit-heating device for heating the crucible unit, the crucible unit-heating device comprising:
a heater disposed so as to surround an outer periphery of the crucible unit; and
a cylindrical-shaped interposed member interposed between the crucible unit and the heater, the interposed member made of a carbonaceous material and disposed so as to surround the outer periphery of the crucible unit.

14. The single crystal pulling apparatus according to claim 13, wherein the interposed member is disposed so as to be spaced with a microgap from the quartz crucible.

* * * * *